(12) United States Patent
Pappalardo et al.

(10) Patent No.: US 11,962,677 B2
(45) Date of Patent: Apr. 16, 2024

(54) SYSTEM AND METHOD FOR CLOCK RESYNCHRONIZATION

(71) Applicant: STMicroelectronics S.r.l., Agrate Brianza (IT)

(72) Inventors: Francesco Pappalardo, Paterno' (IT); Elena Salurso, Mascalucia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1 day.

(21) Appl. No.: 17/720,087

(22) Filed: Apr. 13, 2022

(65) Prior Publication Data
US 2023/0336325 A1    Oct. 19, 2023

(51) Int. Cl.
*H04L 7/033*    (2006.01)
*H03L 7/06*    (2006.01)
*H04L 7/00*    (2006.01)

(52) U.S. Cl.
CPC .............. *H04L 7/0331* (2013.01); *H03L 7/06* (2013.01); *H04L 7/0016* (2013.01); *H04L 7/0054* (2013.01); *H04L 7/0079* (2013.01)

(58) Field of Classification Search
CPC ....... H04L 7/02; H04L 7/0331; H04L 7/0016; H04L 7/0054; H04L 7/0079; H04L 27/06; H03L 7/06

See application file for complete search history.

(56) References Cited

U.S. PATENT DOCUMENTS

| 4,847,874 | A | | 7/1989 | Kroeger et al. |
| 6,043,848 | A | * | 3/2000 | Richter .................. H04N 7/035 348/E7.02 |
| 6,122,336 | A | | 9/2000 | Anderson |
| 6,252,850 | B1 | | 6/2001 | Lauret |
| 6,895,062 | B1 | * | 5/2005 | Wilson ...................... H04L 7/10 375/354 |
| 7,446,616 | B2 | | 11/2008 | Lee |
| 7,532,697 | B1 | | 5/2009 | Sidiropoulos et al. |
| 7,664,118 | B2 | | 2/2010 | Sasson et al. |
| 7,684,531 | B2 | | 3/2010 | Masui et al. |
| 8,599,827 | B2 | | 12/2013 | Irvine |
| 8,625,641 | B2 | | 1/2014 | Liang |
| 9,209,966 | B1 | | 12/2015 | Hossain et al. |
| 9,763,189 | B2 | | 9/2017 | Ang et al. |
| 9,965,360 | B2 | | 5/2018 | Lee et al. |
| 10,826,677 | B2 | | 11/2020 | Chan et al. |

(Continued)

FOREIGN PATENT DOCUMENTS

DE    10310102 B4    10/2007

*Primary Examiner* — Betsy Deppe
(74) *Attorney, Agent, or Firm* — Slater Matsil, LLP

(57) ABSTRACT

A method of processing a data stream includes taking a first number of samples of the data stream using a sampling clock over a first observation window and storing a stored data stream including the first number of samples in a data buffer. A length of the first observation window is determined by a reference clock. A measured number of cycles of the sampling clock are determined from the first number of samples. An error between an expected number of cycles of the sampling clock and the measured number of cycles of the sampling clock in the observation window is measured. The stored data stream corresponding to the first observation window is updated to contain a second number of samples by correcting the first number of samples with the error.

20 Claims, 16 Drawing Sheets

(56) References Cited

U.S. PATENT DOCUMENTS

2007/0201595 A1 8/2007 Stimple et al.
2012/0308234 A1 12/2012 Bianciotto et al.
2015/0349784 A1 12/2015 Bogdan

* cited by examiner

```verilog
always @ (posedge clk or negedge reset_n)
begin
    if (!reset_n) begin
        recovery_phase <='d0;
        counter        <='d0;
        data_valid_int <='d0;
    end
    else begin
        if (recovery_phase == 'b1) begin                                                    //{
            data_valid_int <= (delta_is_negative == 'b0)? 1'b0 : 1'b1;
            if ((delta_is_valid == 'b1) & (delta_count != 'd0))                             //{
            begin
                recovery_phase <='d1;
                counter         <='d0;
            end
            else if (counter == delta_count) begin
                                data_valid_int <='d0;
                counter         <='d0;
                recovery_phase <='d0;
            end
            //}
            else    counter <= counter + 1;
        end
        else //recovery_phase == 0
            if ((delta_is_valid == 'b1) & (delta_count != 'd0))                             //{
            begin
                recovery_phase <='d1;
                counter         <='d1;
            //}
            data_valid_int <= (delta_is_negative == 'b0)? 1'b0 : 1'b1;
            end
            else            data_valid_int <=~data_valid_int;
            //}
        end
        //}
    end
end
```

FIG. 16

SYSTEM AND METHOD FOR CLOCK RESYNCHRONIZATION

TECHNICAL FIELD

The present invention relates generally to a system and method for clock resynchronization, and, in particular embodiments, to a system and method for error correction of an internal clock used in asynchronous communication.

BACKGROUND

Clock synchronization is a topic in computer science and engineering that aims to coordinate otherwise independent clocks. Real clocks will differ after some amount of time even when initially set accurately. This clock drift is caused by clocks counting time at slightly different rates. Communication that relies on counting a fixed number of samples to obtain synchronization may fail due to clock drift.

During an asynchronous transmission between a transmitter and a receiver, the receiver clock can drift and lose synchronization with the transmitter clock. The clock drift desynchronizes the communication between the receiver and transmitter, causing the communication to fail. When the receiver applies oversampling on received data from the transmitter, the internal clock of the receiver is used to evaluate how many samples are taken for each incoming symbol. However, an error on the internal clock means that the evaluation is wrong. After some time, the cumulative error of the internal clock leads to synchronization being lost.

SUMMARY

In accordance with an embodiment, a method of processing a data stream includes: taking a first number of samples of the data stream using a sampling clock over a first observation window, and storing a stored data stream including the first number of samples in a data buffer, where a length of the first observation window is determined by a reference clock; determining a measured number of cycles of the sampling clock from the first number of samples; measuring an error between an expected number of cycles of the sampling clock and the measured number of cycles of the sampling clock in the observation window; updating the stored data stream corresponding to the first observation window to contain a second number of samples by correcting the first number of samples with the error; and decoding the data stream based on processing the second number of samples.

In accordance with another embodiment, a method for resynchronizing a data stream includes: oversampling the data stream to form a sampled data set, where a sampling rate of the oversampling is determined by a sampling clock, the sampled data set being stored in a data buffer; counting a measured number of cycles of the sampling clock over an observation window, where the length of the observation window is determined by a reference clock; indicating the end of the observation window by sending a trigger to a data stream recovery method; executing the data stream recovery method, the data stream recovery method including: determining a difference between the measured number of cycles of the sampling clock over the observation window and an expected number of cycles of the sampling clock over the observation window; and adding or subtracting a number of samples equal to the difference from the sampled data set in the data buffer; and after executing the data stream recovery method, decoding the sampled data set.

In accordance with yet another embodiment, a system for processing a data stream includes: a sampling clock, the sampling clock having a first frequency; a reference clock, the reference clock having a second frequency, the second frequency being smaller than the first frequency, the reference clock being more precise than the sampling clock, the reference clock being configured to measure the length of an observation window; a plurality of processors; and a non-transitory memory storing program instructions to be executed in the plurality of processors, the program instructions including instructions to: measure a difference between an expected number of cycles of the sampling clock in the observation window and a measured number of cycles of the sampling clock in the observation window; and correct a first number of samples taken from a transmission over the observation window by the difference measured, where the samples are taken using the sampling clock.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which:

FIG. 16 illustrates an implementation of a clock recovery algorithm in register-transfer level (RTL), in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments. According to one or more embodiments of the present disclosure, this application relates to a system and method for error correction of a sampling clock used in asynchronous communication. An asynchronous transmission is received and oversampled by a receiver. A sampling clock of the receiver is used to accept samples from the received transmission at a desired frequency in order to achieve a desired data rate. Clock drift of the sampling clock is measured using a reference clock that is slower and more precise. The clock drift measurement provides the difference in clock cycles between the current sampling frequency based on the sampling clock and the desired sampling frequency. This clock drift measurement is then used to add or subtract samples from the incoming stream of samples to achieve the desired data rate. Embodiments of this disclosure provide advantages by achieving a desired data rate without an overly increased power consumption, an overly increased area consumption (e.g., area on a computer chip), an overly increased design complexity, or an overly decreased processing speed. These advantages may save costs while still providing the desired data rate.

Figure 1:
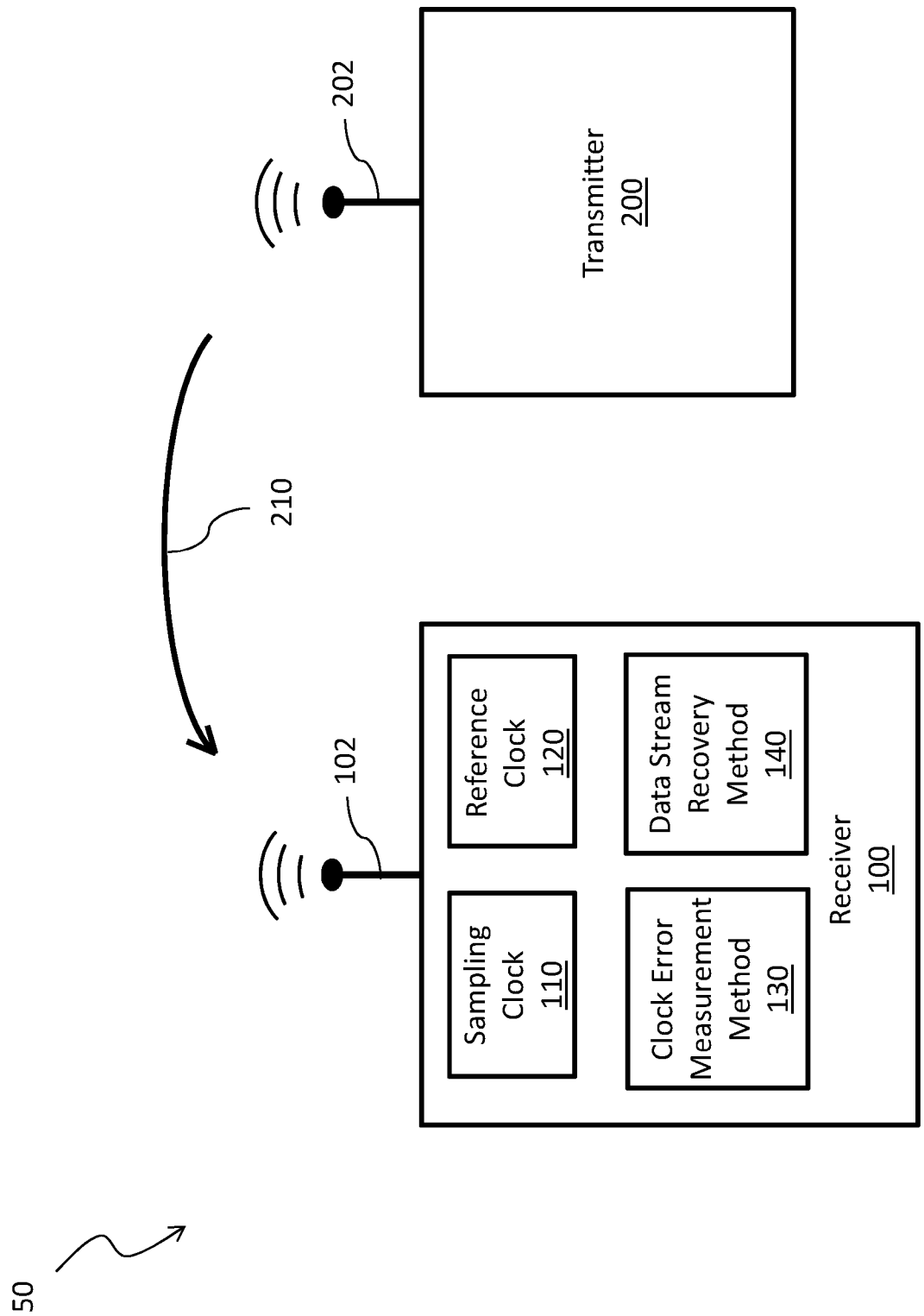
FIG. 1 illustrates an example system including a receiver and a transmitter, in accordance with some embodiments.
Figure 2:
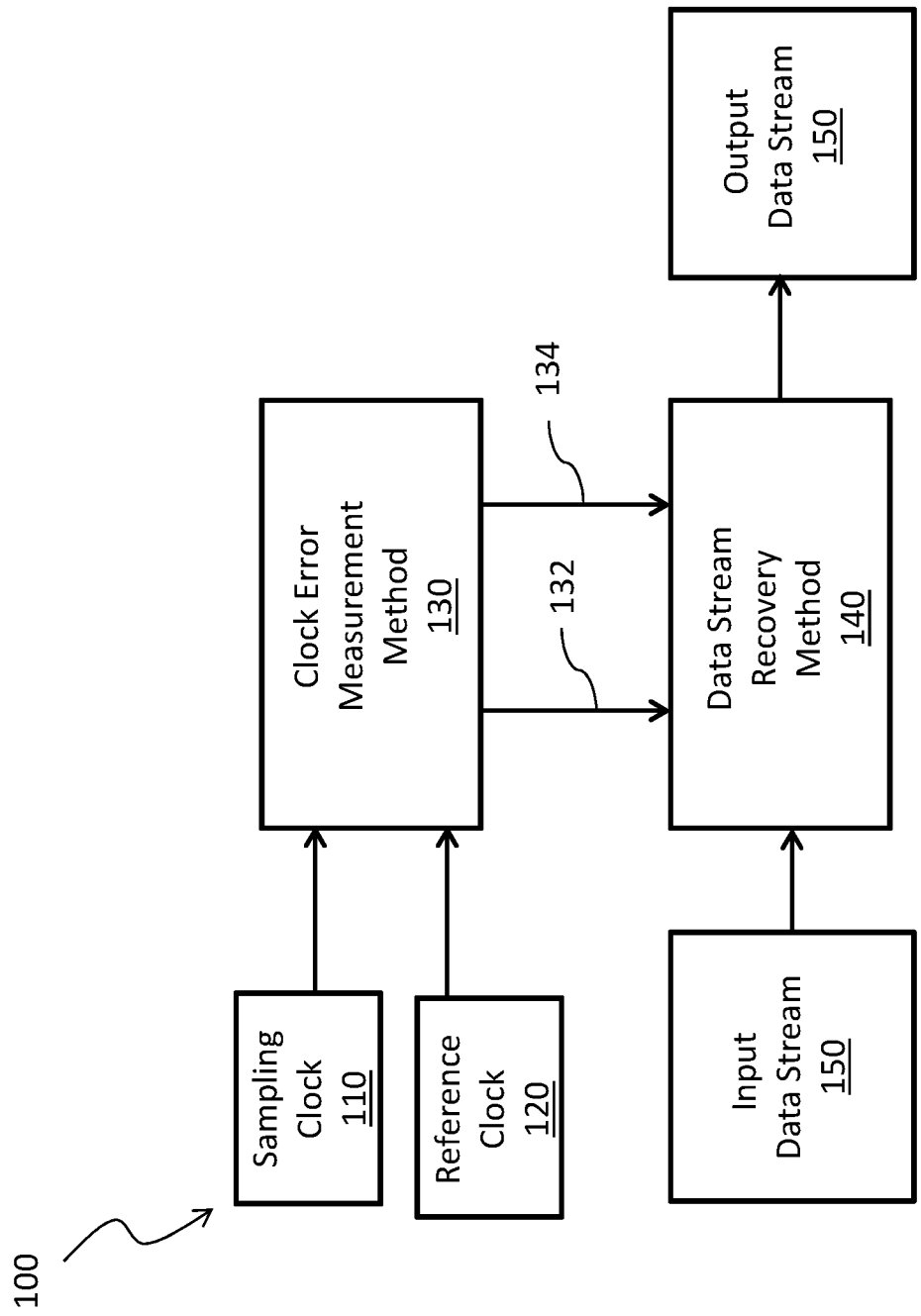
FIG. 2 is a block diagram of a method for clock resynchronization, in accordance with some embodiments.
Figure 3:
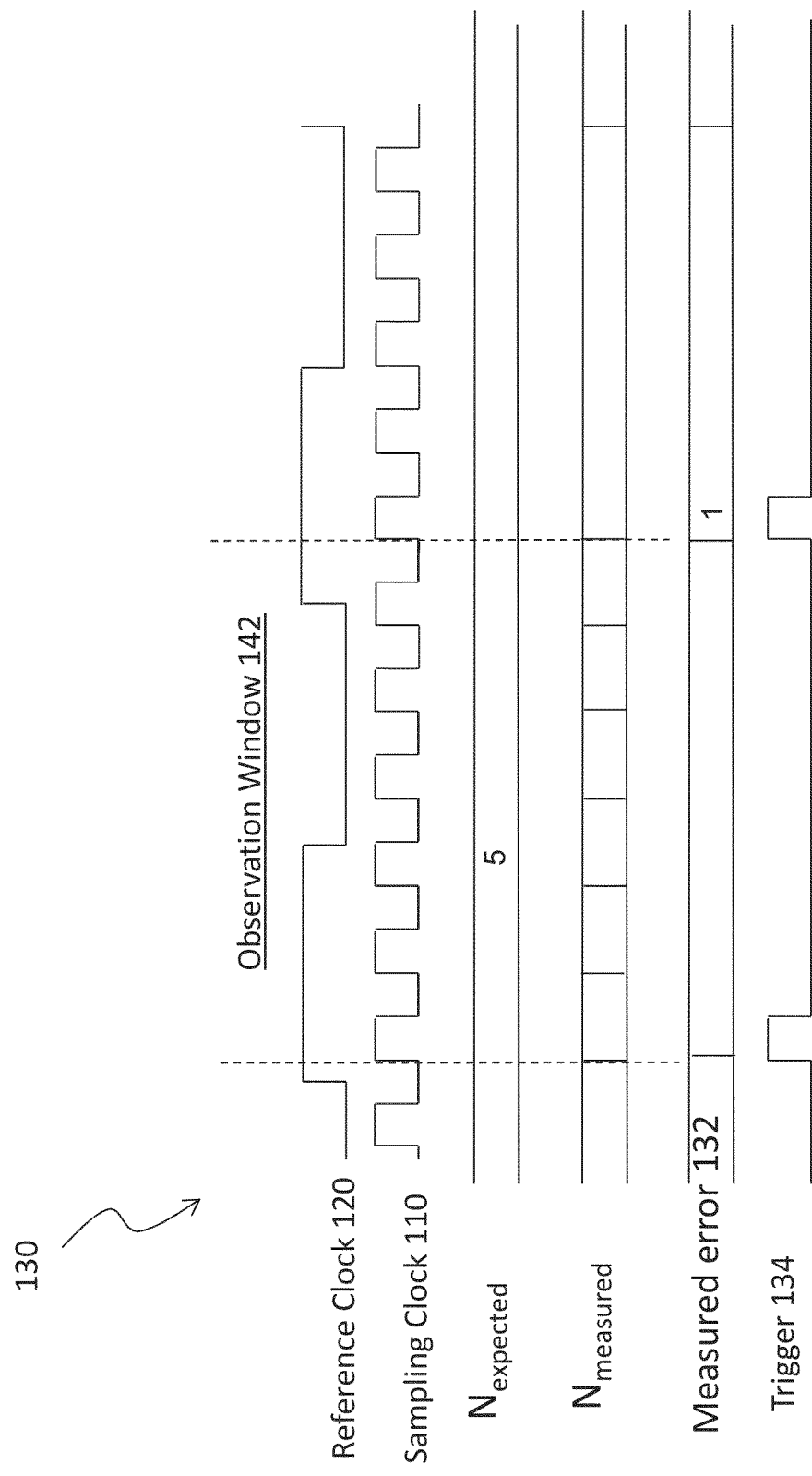
FIG. 3 illustrates an example of an operation of a clock error measurement method, in accordance with some embodiments.
Figure 4:
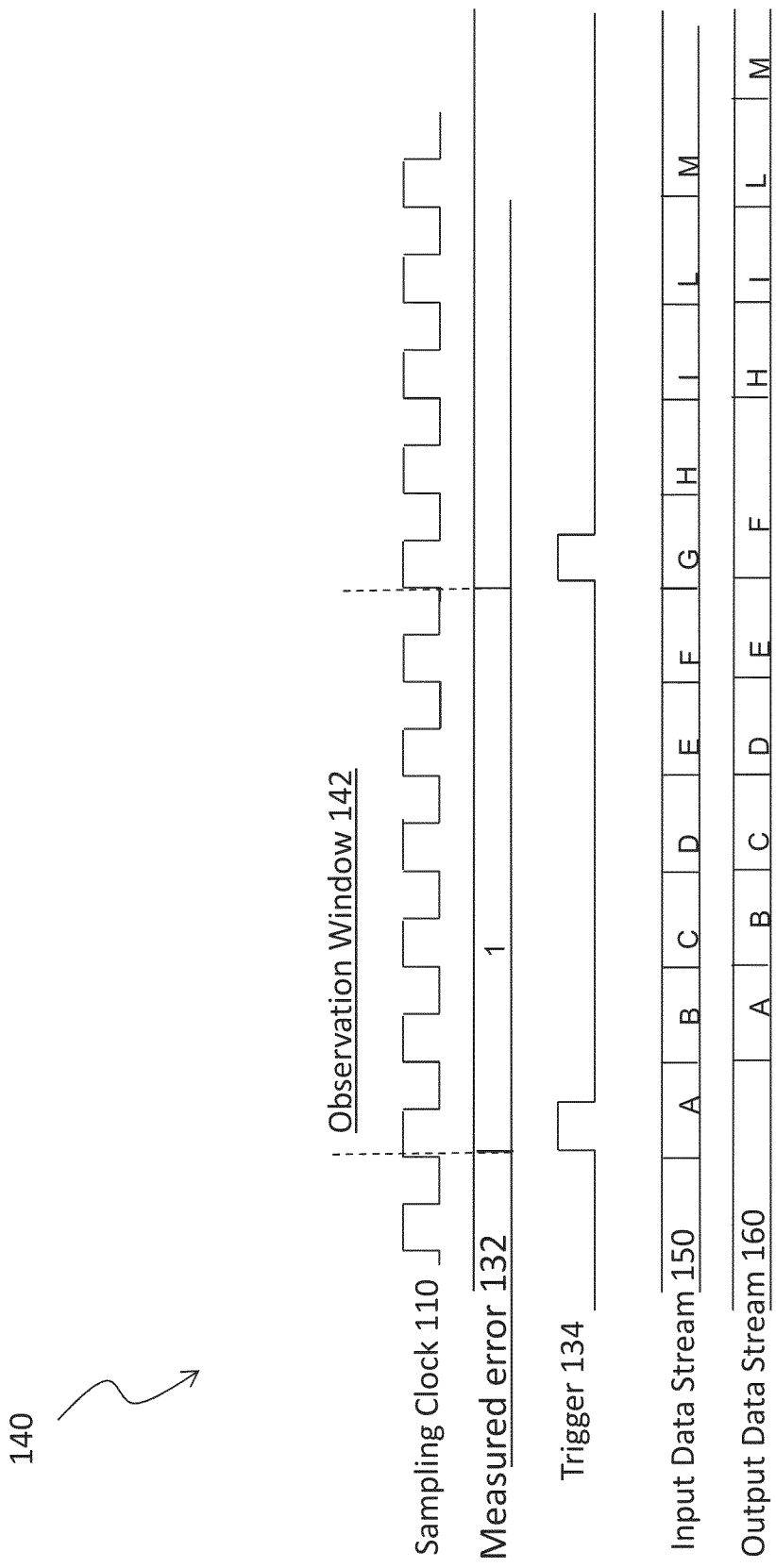
FIG. 4 illustrates an example of an operation of a data stream recovery method, in accordance with some embodiments.
Figure 5:
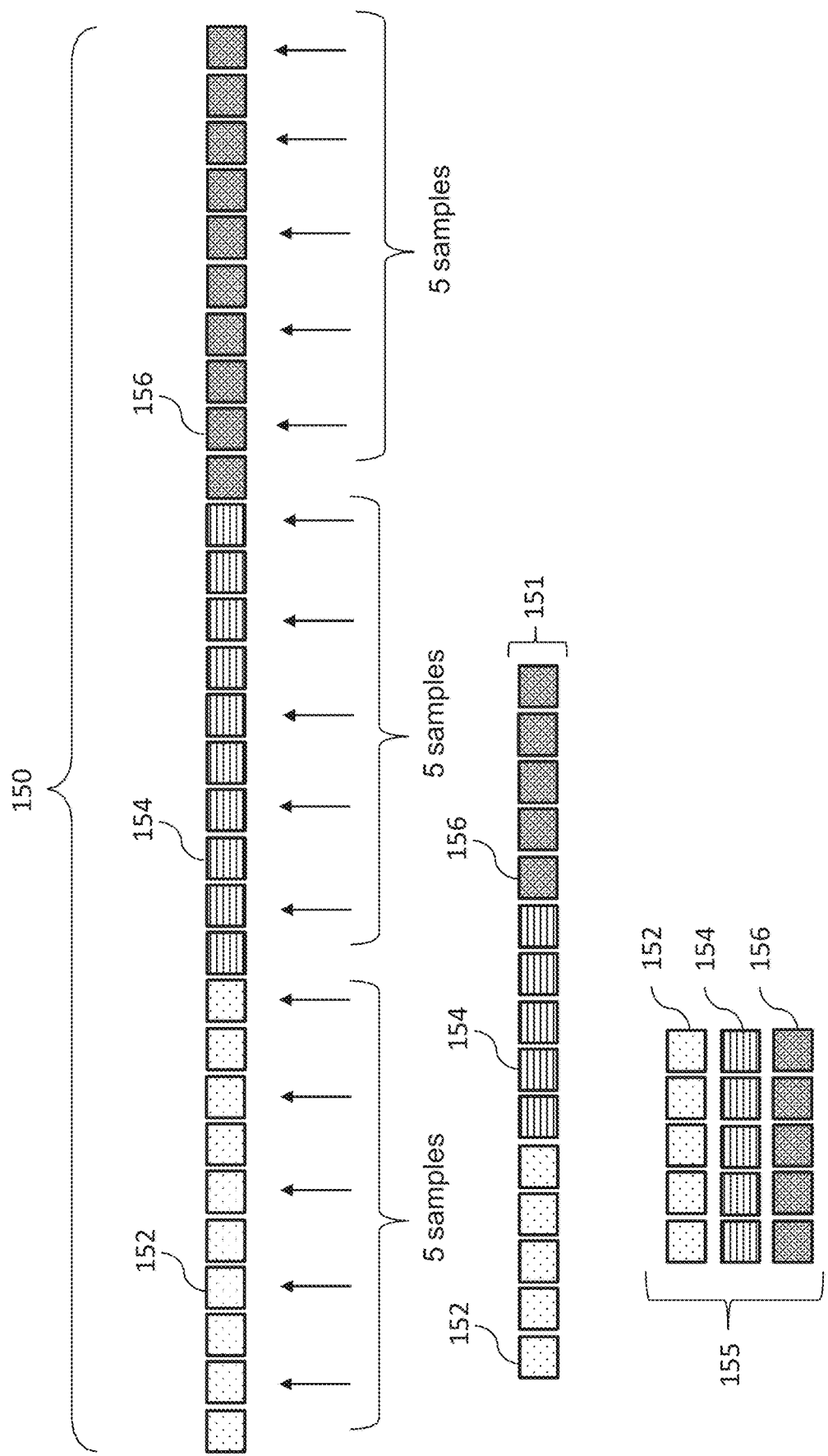
FIGS. 5-7 illustrate example methods of oversampling and slicing a received data stream, in accordance with some embodiments.
Figure 6:
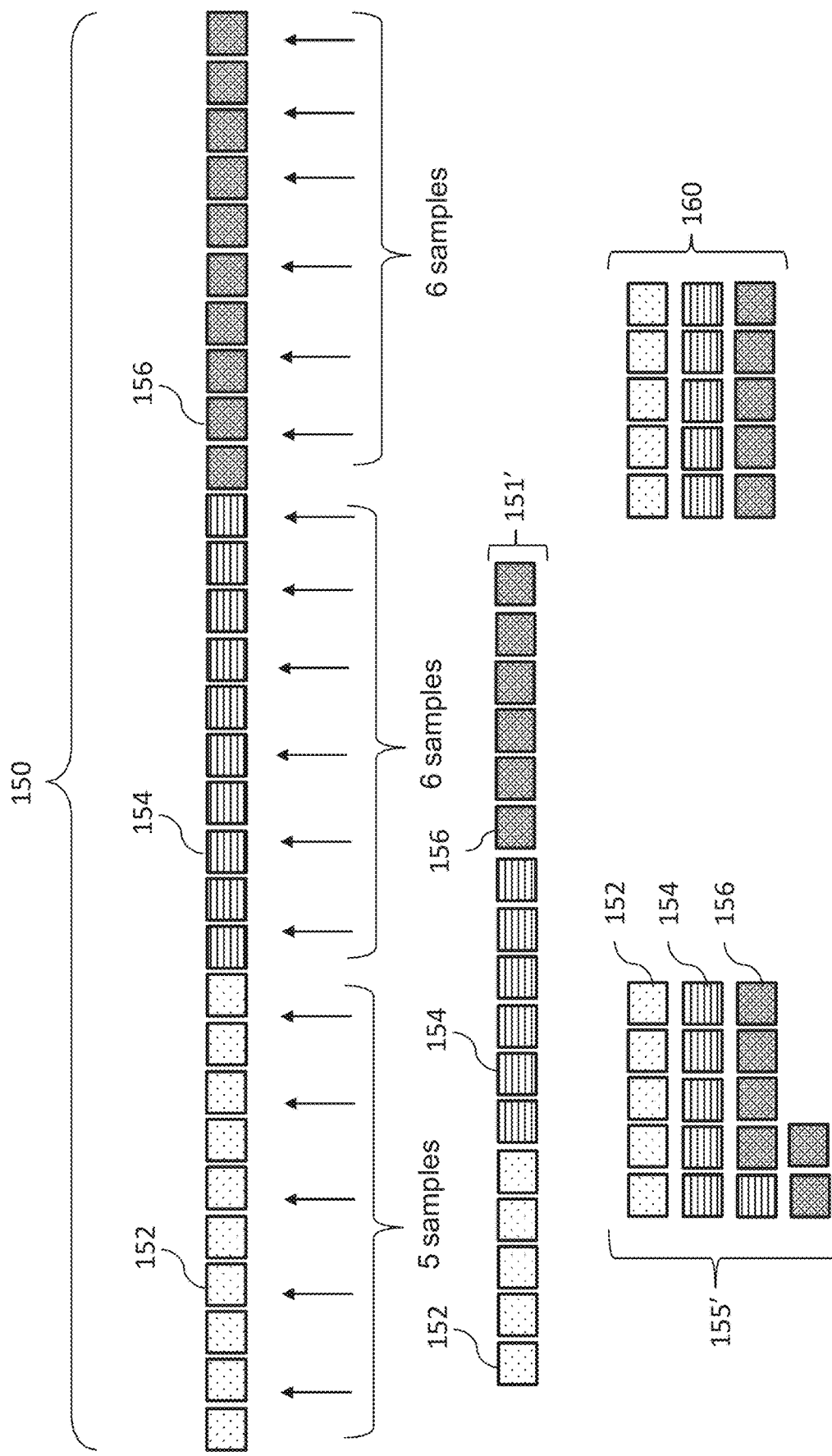
Figure 7:
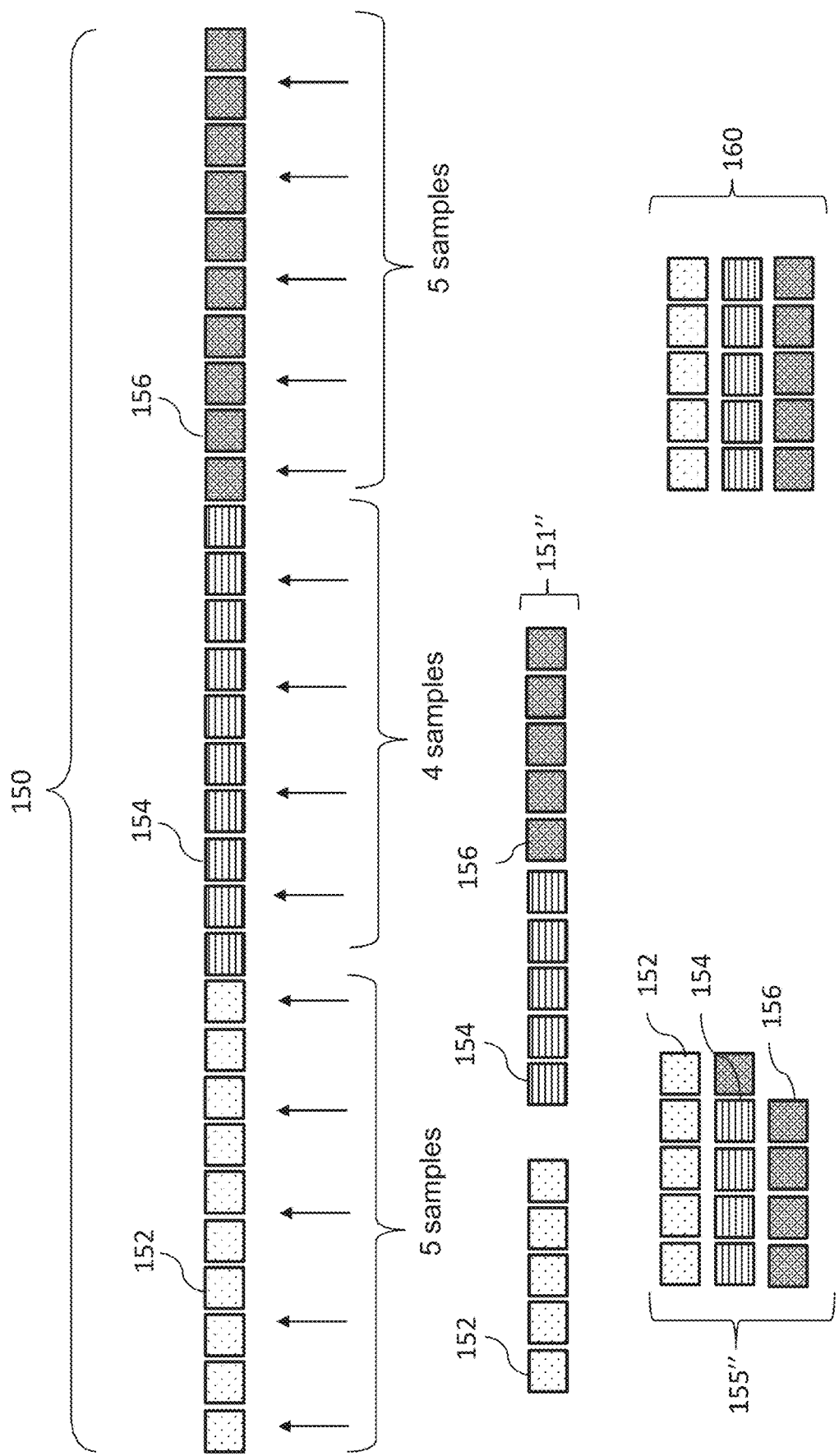
Figure 14:
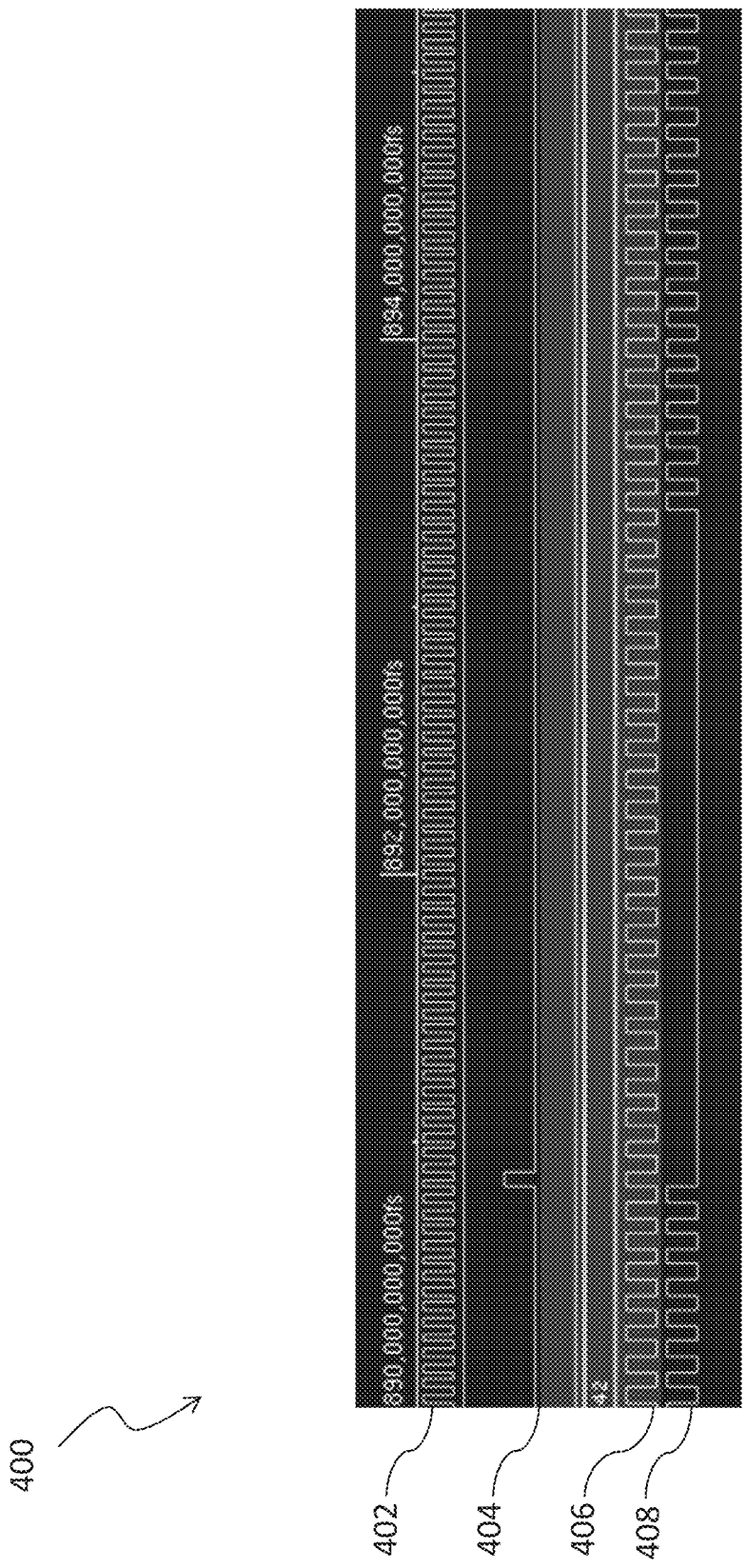
FIG. 14 illustrates a plot of waveforms showing a clock recovery algorithm applied to data taken with a sampling clock having a positive offset, in accordance with some embodiments.
Figure 15:
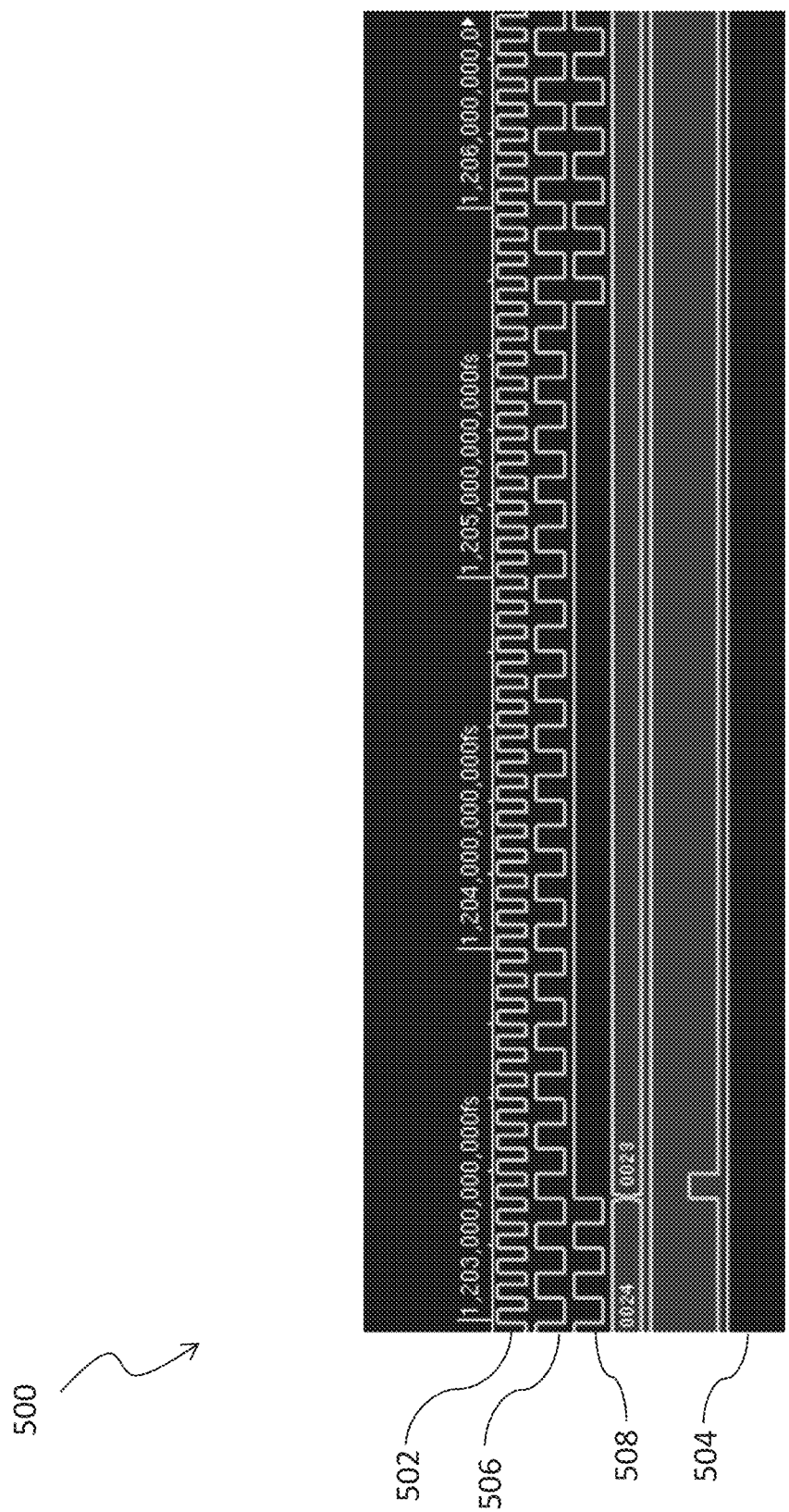
FIG. 15 illustrates a plot of waveforms showing a clock recovery algorithm applied to data taken with a sampling clock having a negative offset), in accordance with some embodiments.

Embodiments of the disclosure are described in the context of the accompanying drawings. FIG. 1 illustrates an example system including a receiver and a transmitter. FIG. 2 is a block diagram of a method for clock resynchronization, and FIGS. 3 and 4 illustrate examples of operations of a clock error measurement method and a data stream recovery method, respectively, performed as parts of the method for clock resynchronization. FIGS. 5-7 illustrate example methods of clock resynchronization in the context of oversampling and slicing a received data stream. FIGS. 8-13 illustrate examples of a waveform being sampled at different rates, resulting desynchronization of the sampling, and correction of the desynchronization by a re-synchronization method. FIGS. 14 and 15 illustrate examples of a clock recovery algorithm applied to data taken with a sampling clock having positive and negative offsets, respectively. FIG. 16 illustrates an implementation of a clock recovery algorithm in RTL.

FIG. 1 illustrates an example system 50 including a receiver 100 and transmitter 200, in accordance with some embodiments. The receiver 100 includes an antenna 102, a sampling clock 110 (also referred to as an internal clock), a reference clock 120, a clock error measurement method 130, and a data stream recovery method 140. The transmitter 200 includes an antenna 202. The transmitter 200 broadcasts a transmission 210 of data with the antenna 202. In some embodiments, the transmission 210 is an asynchronous transmission, such as an on-off keying (OOK) modulation of an IEEE 802.11.ba standard carrier wave. The preamble of the transmission 210 may be free of timing information (e.g., Manchester coding), so correct detection of the incoming data may depend on internal clock accuracy of the receiver 100. The receiver 100 may expect a fixed data rate from the transmission 210 and count the fixed data rate using an internal clock to select from oversamples of the transmission 210. Adding and subtracting samples on fixed intervals may reduce or prevent communication loss resulting from deviation on the frequency of the sampling clock 110, allowing the communication to continue smoothly even when the timing of the sampling clock 130 has an offset.

The transmission 210 is received by the receiver 100 through the antenna 102 and oversamples of the data stream from the transmission 210 are provided to the data stream recovery method 140. Next, the data stream recovery method 140 compensates for clock drift of the sampling clock 110 using feedback from the reference clock 120 and the clock error measurement method 130.

It should be appreciated that the system 50 of FIG. 1 is a non-limiting example, and following embodiments may be implemented in any suitable system, including hardware, software (e.g., Matlab, RTL, or the like), and firmware. In some embodiments, the receiver 100 is a wake-up radio using the IEEE 802.11ba standard. However, the receiver 100 may be any suitable receiver, using any protocol such as WiFi, Bluetooth, Bluetooth Low Energy (BLE), ZeegBee, or the like.

FIG. 2 is a block diagram showing the operational flow of a method for clock resynchronization in the receiver 100, in accordance with some embodiments. The sampling clock 110 and the reference clock 120 provide time signals to the clock error measurement method 130. The input data stream 150 is oversampled from a source data stream, such as the transmission 210 (see above, FIG. 1), and stored for subsequent processing (e.g., in a data buffer in a non-transitory computer readable storage medium such as random access memory). After being stored, the input data stream 150 is also referred to as a stored data stream. The data stream recovery method 140 receives a measured error 132 of the sampling clock 110 and a trigger 134 from the clock error measurement method 130, which it uses to determine a desired sampling rate from the input data stream 150. Adding or subtracting samples may achieve the desired data rate even when the sampling clock 110 has an offset from the desired sampling frequency. The properly sampled data is then output by the data stream recovery block as the output data stream 160 and stored as a stored data stream for subsequent processing (e.g., in a data buffer). The subsequent processing may include decoding the output data stream.

The sampling clock 110 is used to provide a sampling signal for the rate of sampling from the input data stream 150. In embodiments, the sampling signal is 4 MHz or greater, such as in a range of 4 MHz to 64 MHz, according to the desired oversampling rate. The sampling signal may be a square wave, a sinusoidal wave, a sawtooth wave, or the like. The sampling signal may have an error rate up to 8%. In some embodiments, the sampling clock 110 is an internal clock of the receiver 100, such as a clock directly derived from the carrier frequency itself or the like. However, any clock suitable for providing a sampling rate may be used.

The reference clock 120 is used to correct for cumulative error in the rate of the sampling clock 110 and provides a slower and more precise reference signal with a smaller frequency than the sampling clock 110, such as in a range of 1 KHz to 64 KHz. The reference signal may be a square wave, a sinusoidal wave, a sawtooth wave, or the like. The reference signal may have an error rate in a range of 20 ppm to 40 ppm. In some embodiments, the reference clock 120 is internal to the receiver 100 and is a crystal oscillator or the like. However, any clock suitable for providing a precise reference signal may be used. In some embodiments, the reference clock 120 is located on a same semiconductor chip as the sampling clock 110.

The clock error measurement method 130 receives the sampling signal from the sampling clock 110 and the reference signal from the reference clock 120. The clock error measurement method 130 then computes the measured error 132 of the sampling signal relative to the reference signal in an observation window with a fixed length, such as one cycle to sixteen cycles of the reference clock 120. However, any suitable number of cycles may be chosen according to the desired precision of the clock error measurement method 130. Next, the clock error measurement method 130 provides the measured error 132 for an observation window and a trigger 134 indicating the end of the observation window to the data stream recovery method 140. The clock error measurement method 130 may be implemented in hardware (e.g., as an application-specific integrated circuit (ASIC)) or software (e.g., as programming stored in a non-transitory computer readable storage medium for execution by a microprocessor such as a CPU).

In some embodiments, the clock error measurement method 130 computes the measured error 132 continuously during operation of the receiver 100. For example, the clock error measurement method 130 may compute the measured error 132 every cycle of the reference clock 120, or every two to sixteen cycles. In this case, the error of the sampling clock 110 is continuously corrected for and so does not accumulate. The clock error measurement method 130 will then provide continuous and effective correction of the sampling rate that is not dependent on the length of the incoming data (e.g., the transmission 210; see above, FIG. 1).

In some embodiments, the clock error measurement method 130 computes the measured error 132 just once, such as at the start of the operation of the receiver 100. Computing the measured error 132 just once may reduce power consumption used by the computations of the clock error measurement method 130. This may be advantageous for shorter data streams for which correcting the error of the sampling clock 110 once is sufficient. These shorter data streams may have lengths of 2048 samples with an oversampling factor of 16 to 8192 samples with an oversampling factor of 16 over a total time interval of 128 µs to 512 µs. The correction by the singly measured error 132 is effective due to the shorter length of the data streams, as error beyond the singly measured error 132 does not have enough time to accumulate significantly.

The data stream recovery method 140 receives oversamples of data from the input data stream 150. Using the measured error 132 and the trigger 134 provided by the clock error measurement method 130, the data stream recovery method 140 adds or subtracts samples from the input data stream 150 at fixed intervals to achieve a desired data rate in the output data stream 160, which may then be stored in a data buffer. The output data stream 160 may be provided to other components of the receiver 100. The desired data rate may match the intended data rate of the transmission 210 (see above, FIG. 1). This enables the communication to continue smoothly even when the sampling clock 110 has an offset and reduces or prevents communication loss.

The data stream recovery method 140 may be implemented in hardware (e.g., as an application-specific integrated circuit (ASIC)) or software (e.g., as programming stored in a non-transitory computer readable storage medium for execution by a microprocessor such as a CPU) and may be executed either during runtime or after runtime. In some embodiments, the data rate is lower than the frequency of the sampling clock 110 and the correction of the data stream recovery method 140 is performed during active runtime (e.g., while the receiver 100 is receiving the transmission 210). In some embodiments, the fully oversampled input data stream 150 and the measured errors 132 are saved (e.g., to a computer readable storage medium) and the algorithm of the data stream recovery method 140 is run on the saved data offline (e.g., after the transmission 210 has been completed).

FIG. 3 illustrates an example of an operation of the clock error measurement method 130, in accordance with some embodiments. An observation window 142 is measured using the reference signal from the reference clock 120. In the illustrated example, the observation window 142 is equivalent to one cycle of the reference clock 120. However, any suitable number of cycles of the reference clock 120 may be used. When the observation window 142 is complete, the clock error measurement method 130 marks it with a trigger 134. In some embodiments, the trigger 134 is a pulse sent to the data stream recovery method 140, such as a square wave pulse. However, any suitable trigger 134 may be used to mark the end of the observation window 142. For example, in some embodiments where subsequent processing of the data stream recovery method 140 is performed offline, the trigger 134 may be the end of the saved data block of the observation window 142.

The clock error measurement method 130 determines the measured error 132 of the observation window 142. The observation window 142 has an expected number of data samples $N_{expected}$ that is determined based on the length of the observation window 142 and the expected data sampling rate. In the illustrated example of FIG. 3, $N_{expected}$ is 5. The clock error measurement method 130 then counts the measured number of cycles $N_{measured}$ of the sampling clock 110 in the observation window 142. In the illustrated example of FIG. 3, $N_{measured}$ for the observation window 142 is 6. The measured error 132 for the observation window 142 is the difference between $N_{measured}$ and $N_{expected}$, which is 1 in the illustrated example of FIG. 3. The clock error measurement method 130 then provides the measured error 132 and the trigger 134 to the data stream recovery method 140.

The length of the observation window 142 may be in a range of 1 µs to 250 µs and may contain 8 samples to 2000 samples. A longer observation window 142 allows for more precise detection of the frequency error of the sampling clock 110. However, as the subsequent correction to the number of samples taken from the input data stream 150 is performed after the end of the observation window 142, a longer observation window may introduce a longer delay for the correction of the measured error 132.

FIG. 4 illustrates an example of an operation of the data stream recovery method 140, in accordance with some embodiments. The data stream recovery method 140 receives the measured error 132 and the trigger 134 from the clock error measurement method 130. The trigger 134 determines the end of the observation window 142. The measured error 132 is used by the data stream recovery method 140 to determine how many samples to add or subtract from the input data stream 150 in the observation window 142. The input data stream 150, which may be stored in a data buffer, contains data samples A, B, C, D, E, F, G, H, I, L, and M, of which six samples A-F are in the observation window 142.

In the example illustrated by FIG. 4, the measured error is 1 and the input data stream 150 contains 6 samples A, B, C, D, E, and F in the observation window 143 as counted by the sampling clock 110. As the measured error 132 is 1, the data stream recovery method 140 subtracts 1 sample from the observation window 142 to realign the output data stream 160 with the desired data rate. This updates the output data stream 160 to have the desired number of samples in the portion of the output data stream 160 corresponding to the observation window 142. As a result, the output data stream 160 contains data samples A, B, C, D, E, F, H, I, L, and M, of which five samples A-E are in the observation window 142. This is the correct expected number of data samples $N_{expected}$ (see above, FIG. 3).

In some embodiments, the data stream recovery method 140 removes excess samples from the observation window 142 by pushing the last sample (e.g., sample F) into the following observation window and removing the subsequent sample (e.g., sample G) from the output data stream 160. In other embodiments, the data stream recovery method 140 removes excess samples from the observation window 142 in the output data stream 160 by removing excess samples at the beginning of the observation window 142. Data samples may be removed by deleting the samples from a data buffer or forcing the valid bit of the data samples to be zero, so that the samples with valid bits set to zero are not processed by a subsequent step of an algorithm (e.g., of the receiver 100).

FIGS. 5-7 illustrate example methods of oversampling and slicing a received data stream, in accordance with some embodiments. FIG. 5 illustrates an example of oversampling and slicing a received data stream when the sampling clock is ideal (in other words, without timing error). FIG. 6 illustrates an example of oversampling and slicing the received data stream when the sampling clock is faster than the ideal rate. FIG. 7 illustrates an example of oversampling and slicing the received data stream when the sampling clock is slower than the ideal rate.

In FIG. 5, an input data stream 150 is received containing a first symbol 152, a second symbol 154, and a third symbol 156. The symbols may be, e.g., pulses in digital baseband transmission, with a direct correspondence between each symbol and a small unit of data. For example, symbols may be digital bits represented by pulses with a length of about 2 μs. However, any suitable symbols for transmission of data may be used.

The input data stream 150 is expected to be sampled at a rate of five times the data rate. It should be appreciated that the sampling rate of five times the data rate is a non-limiting example, and that that sampling rate may be any suitable rate, such as eight to sixteen times the data rate. In the example of FIG. 5, the sampling clock operates at an ideal frequency with no error. As such, the first symbol 152, the second symbol 154, and the third symbol 156 are each sampled five times in a sampled data set 151. The sampled data set 151 is subsequently sliced by a processor (e.g., a CPU) into a sliced data set 155 with three data slices. The first data slice contains five samples of the first symbol 152, the second data slice contains five samples of the second symbol 154, and the third data slice contains five samples of the third symbol 156. An algorithm for subsequent processing of the sliced data set 155, such as decoding the symbols of the sliced data set 155, may be implemented in hardware or software. For example, while decoding a transmission with an on-off keying (OOK) format, the processing algorithm may use the expected sampling rate and symbol rate to convert a received data signal to binary values. The decoded binary values may then be further processed to extract, e.g., instructions from the data. The processing algorithm is configured to expect five samples for each successive symbol in the sliced data set 155, and five samples for each of the first symbol 152, the second symbol 154, and the third symbol 156 are present in the sliced data set 155 for the example of FIG. 5 where the sampling clock operates at an ideal frequency.

In the example of FIG. 6, the sampling clock is faster than the ideal rate. As a result, the first symbol 152 is sampled five times, the second symbol 154 is sampled six times, and the third symbol 156 is sampled six times, producing a sampled data set 151'. A subsequent slicing of the sampled data set 151' into a sliced data set 155' results in a first data slice containing five samples of the first symbol 152, the second data slice containing five samples of the second symbol 154, and the third data slice containing one sample of the second symbol 154 and four samples of the third symbol 156, with two additional samples of the third symbol. This is different from the expectation of the processing algorithm of five samples for each successive symbol and may lead to errors.

To reduce or prevent these errors, the data stream recovery method 140 (see above, FIG. 4) uses the measured error 132 from the clock error measurement method 130 to determine the correct number of samples to subtract from the sampled data set 151'. In the example of FIG. 6, two samples are removed from the sampled data set 151'; a second symbol 154 and a third symbol 156. This produces a corrected sliced data set for the output data stream 160 that contains the expected five samples for each of the first symbol 152, the second symbol 154, and the third symbol 156, which corrects the errors resulting from the faster sampling clock rate.

In the example of FIG. 7, the sampling clock is slower than the ideal rate. As a result, the first symbol 152 is sampled five times, the second symbol 154 is sampled four times, and the third symbol 156 is sampled five times, producing a sampled data set 151". A subsequent slicing of the sampled data set 151" into a sliced data set 155" results in a first data slice containing five samples of the first symbol 152, the second data slice containing four samples of the second symbol 154 and one sample of the third symbol 156, and the third data slice containing four samples of the third symbol 156. This is different from the expectation of the processing algorithm of five samples for each successive symbol and may lead to errors.

To reduce or prevent these errors, the data stream recovery method 140 (see above, FIG. 4) uses the measured error 132 from the clock error measurement method 130 to determine the correct number of samples to add to the sampled data set 151". In the example of FIG. 7, one sample is added to the sampled data set 151"; an additional second symbol 154, which may be done by duplicating one of the sampled second symbols 154. The resulting corrected sliced data set for the output data stream 160 then contains the expected five samples for each of the first symbol 152, the second symbol 154, and the third symbol 156, correcting the error resulting from the slower sampling clock rate.

Figure 8:
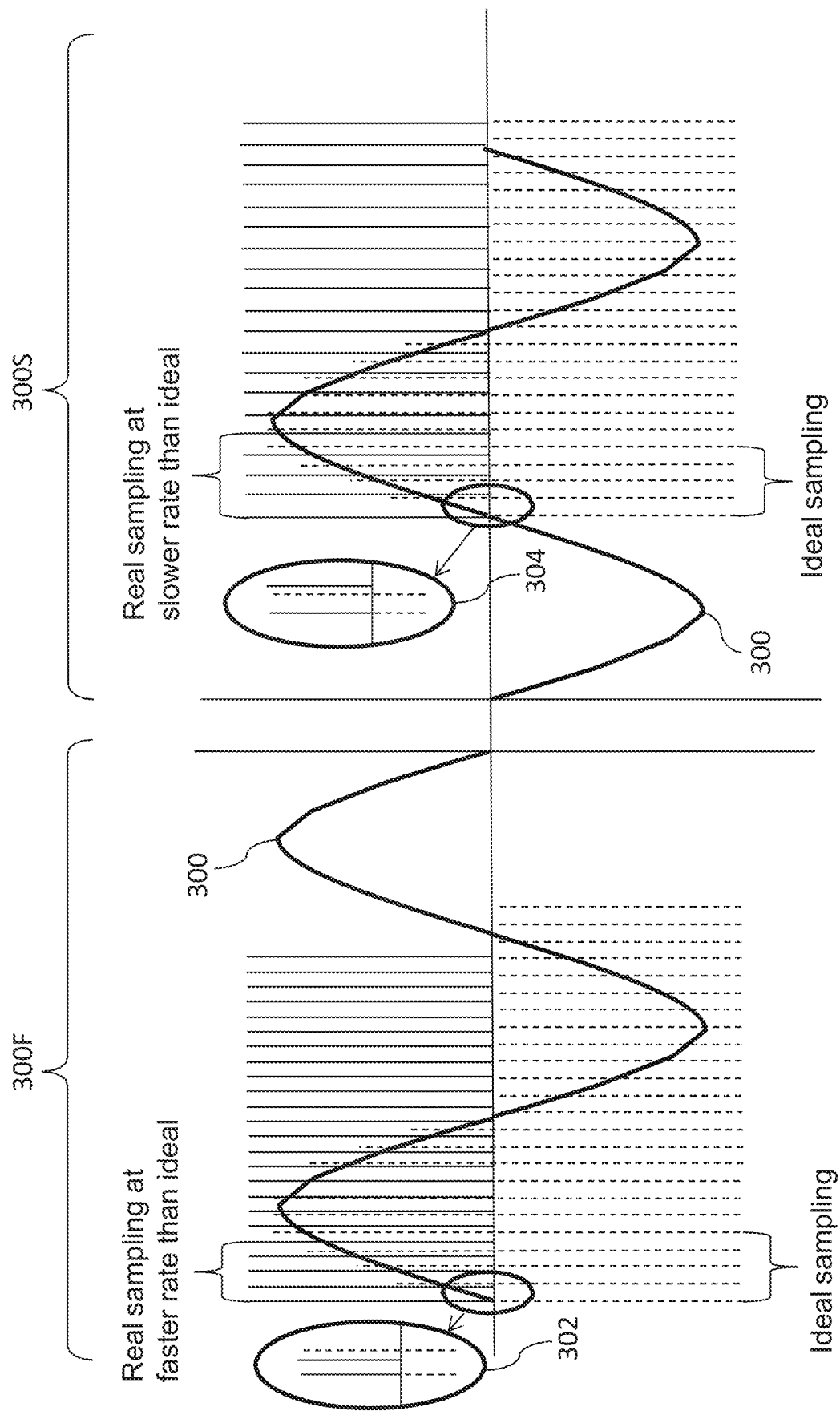
FIGS. 8-13 illustrate examples of a waveform being sampled at different rates, resulting desynchronization, and correction of the desynchronization by re-synchronization, in accordance with some embodiments.

FIGS. 8 through 13 illustrate examples of a waveform 300 being sampled at an ideal rate, at a faster than ideal rate, at a slower than ideal rate, the resulting desynchronization from the differences from the ideal rate, and correction of the desynchronization by re-synchronization, in accordance with some embodiments. FIG. 8 illustrates the waveform 300 being sampled at an ideal sampling rate (e.g. 16 MHz, shown by dashed lines). In region 300F on the left, the waveform 300 is also sampled at a real sampling rate (shown by solid lines) that is faster than ideal sampling rate, and in region 300S on the right, the waveform 300 is also sampled at a real sampling rate that is slower than the ideal sampling rate. Region 302 illustrates a detailed view of the real sampling rate that is faster compared to the ideal sampling rate, and region 304 illustrates a detailed view of the real sampling rate that is slower compared to the ideal sampling rate.

Figure 9:
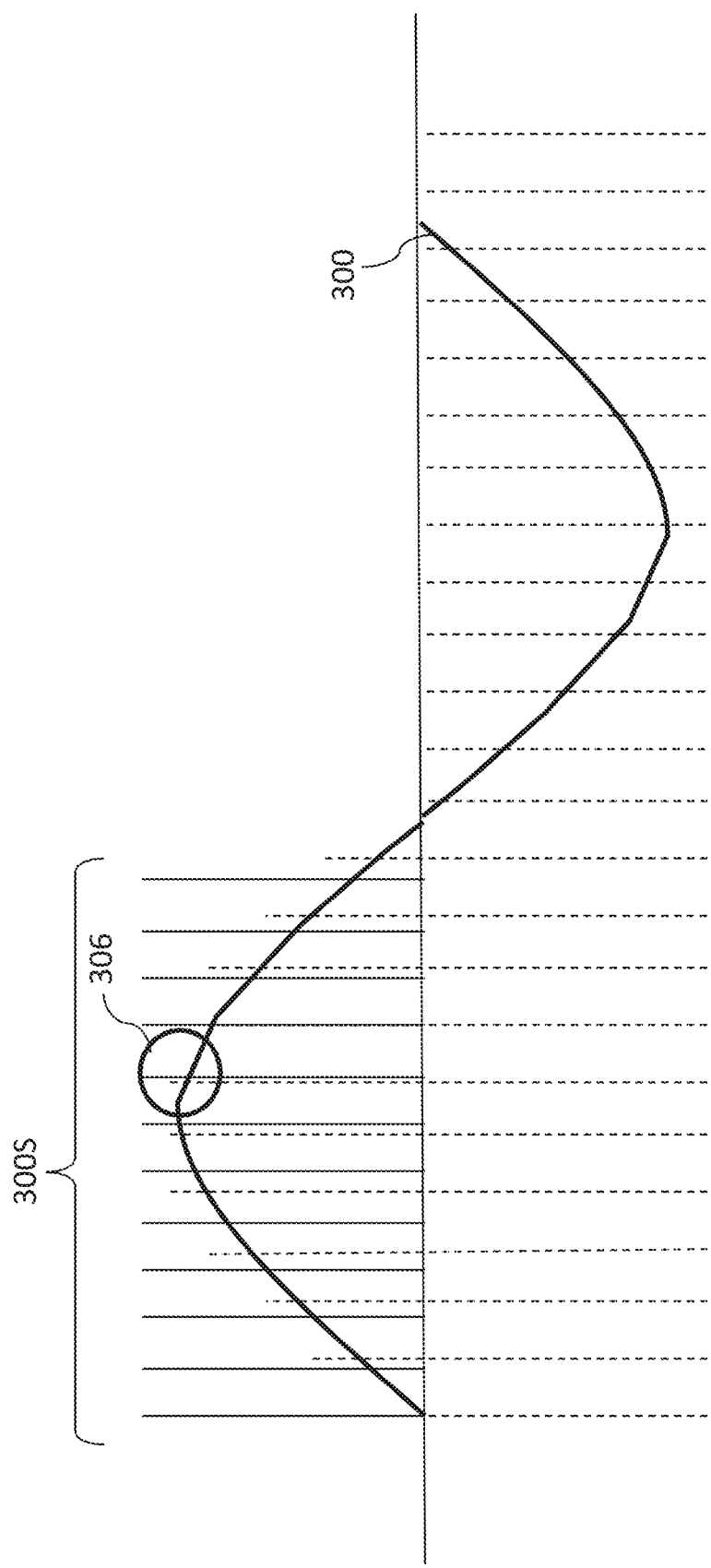

FIG. 9 illustrates an example of desynchronization between an ideal sampling rate (shown as dashed lines) and a real sampling rate (shown as solid lines) that is slower than the ideal sampling rate in a region 300S of the waveform 300. The ideal sampling rate and the slower than ideal sampling rate are synchronized on the left of the region 300S where the waveform 300 crosses the midline, but in the circled region 306, the slower than ideal sampling rate has fallen behind the ideal sampling rate by a full sample. The example of FIG. 9 illustrates a larger error between an ideal sampling rate and a real sampling rate that is slower than the ideal rate by a larger degree than is likely to occur in a real system for the purpose of clarity. However, even a small difference between the real rate of a sampling clock and the ideal rate will cumulatively add to a significant error over many cycles and lead to desynchronization. For example, an error of 1% between a real sampling rate and an ideal sampling rate will lead to a gain or loss of one sample every 100 cycles.

Figure 10:
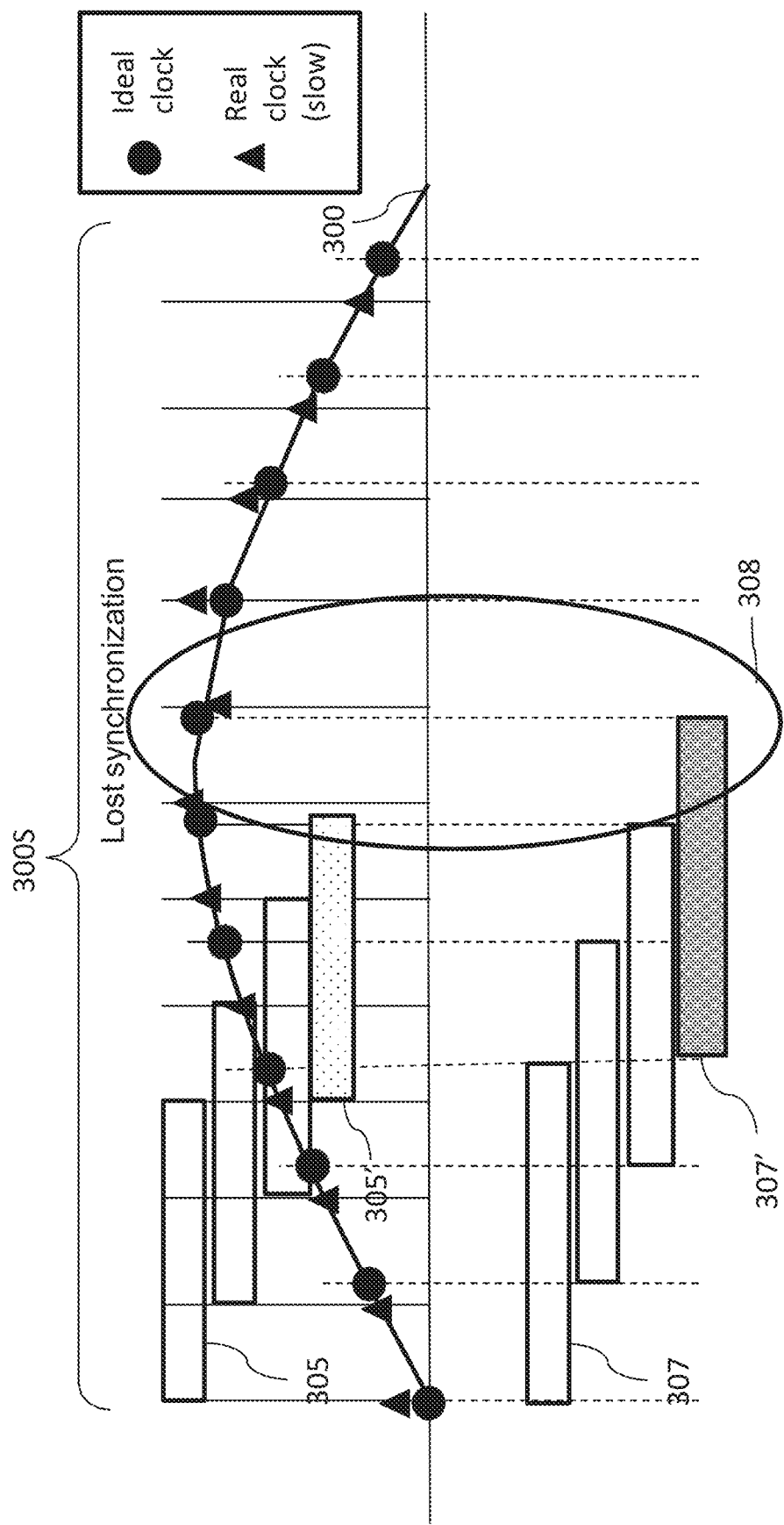

FIG. 10 illustrates another example of desynchronization between an ideal clock (with sampling times shown as round dots) with an ideal sampling rate (shown as dashed lines) and a real sampling clock (with sampling times shown as triangles) with a real sampling rate (shown as solid lines) that is slower than the ideal sampling rate in a region 300S of the waveform 300. The waveform 300 is oversampled by the ideal clock to form data slices 307, and the waveform 300 is oversampled by the real clock to form data slices 305. Each of the data slices 305 and the data slices 307 contains three samples. However, the data slices may contain any suitable number of samples.

As shown in FIG. 10, the data slice 305' loses synchronization with the data slice 307' in region 308. This is due to the real sampling clock having a slower sampling rate than the ideal clock, leading to the data slice 305' being behind the data slice 307' by a full cycle of the ideal clock. This may lead to different numbers of symbols than expected by an algorithm for subsequent data processing, producing errors.

Figure 11:
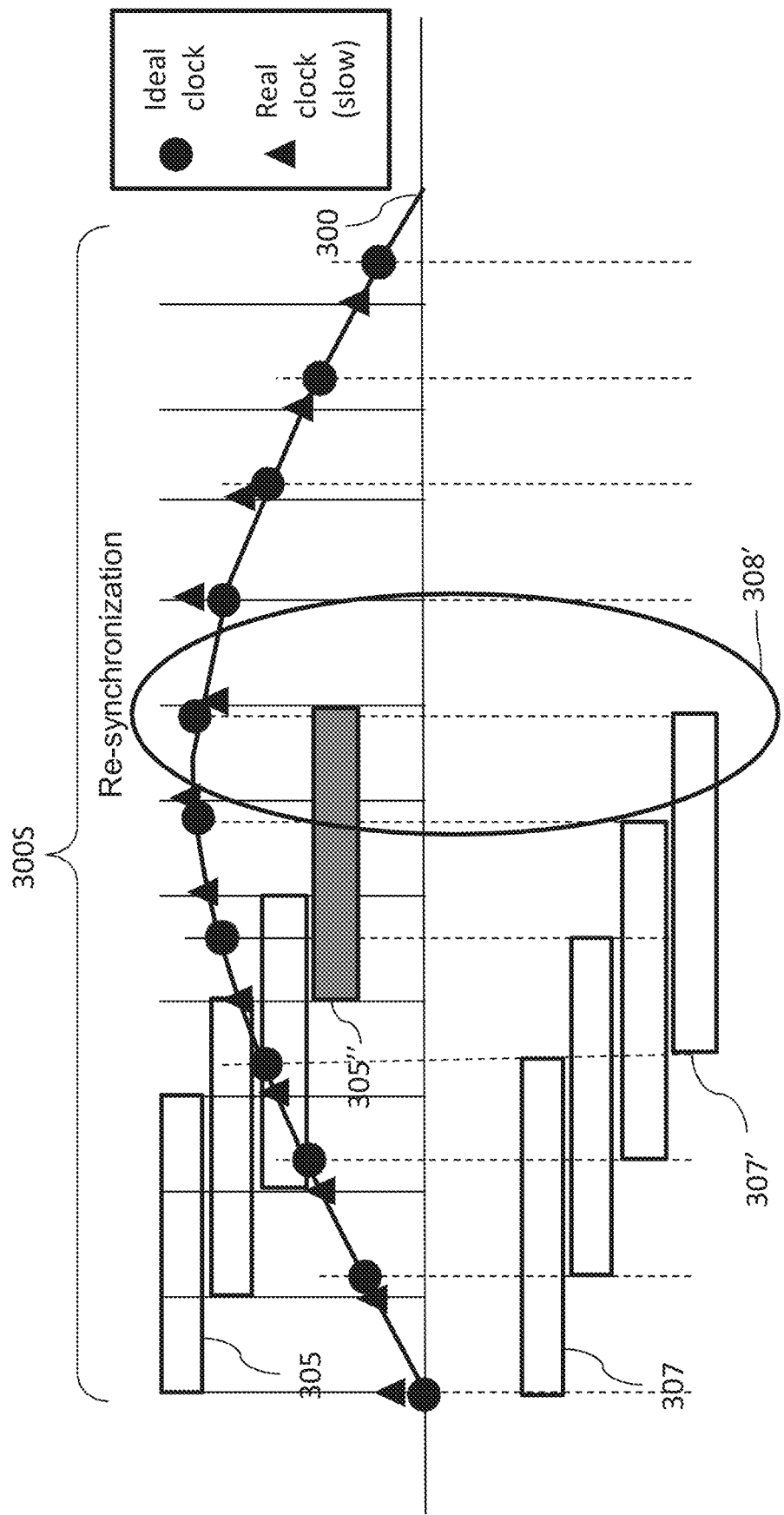

FIG. 11 illustrates a re-synchronization in region 308' of a data slice 305" with the data slice 305'. The data slice 305" is produced by shifting the data slice 305' forward by a proper number of cycles (e.g., one cycle) of the real clock. This forwards shift may be performed by, e.g., the clock recovery algorithm described above with respect to FIGS. 2-7. The re-synchronization reduces or prevents errors in subsequent data processing.

Figure 12:
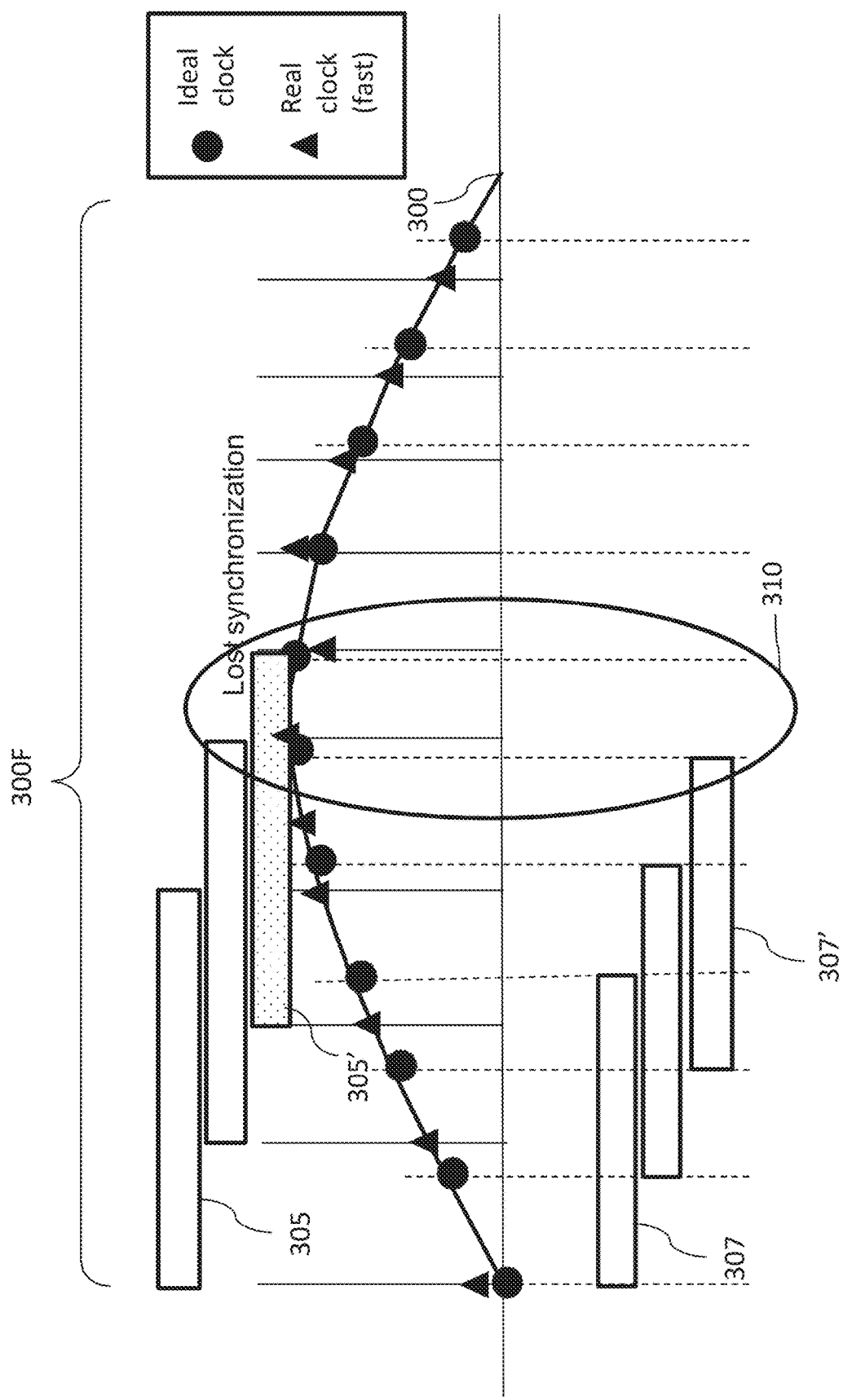

FIG. 12 illustrates an example of desynchronization between an ideal clock (with sampling times shown as round dots) with an ideal sampling rate (shown as dashed lines) and a real sampling clock (with sampling times shown as triangles) with a real sampling rate (shown as solid lines) that is faster than the ideal sampling rate in a region 300F of the waveform 300. The waveform 300 is oversampled by the ideal clock to form data slices 307 and the waveform 300 is oversampled by the real clock to form data slices 305. However, the data slice 305' loses synchronization with the data slice 307' in region 310. This is due to the real sampling clock having a faster sampling rate than the ideal clock, leading to the data slice 305' being ahead of the data slice 307' by a full cycle of the ideal clock. This may produce errors in an algorithm for subsequent data processing due to data slices containing different numbers of symbols than expected.

Figure 13:
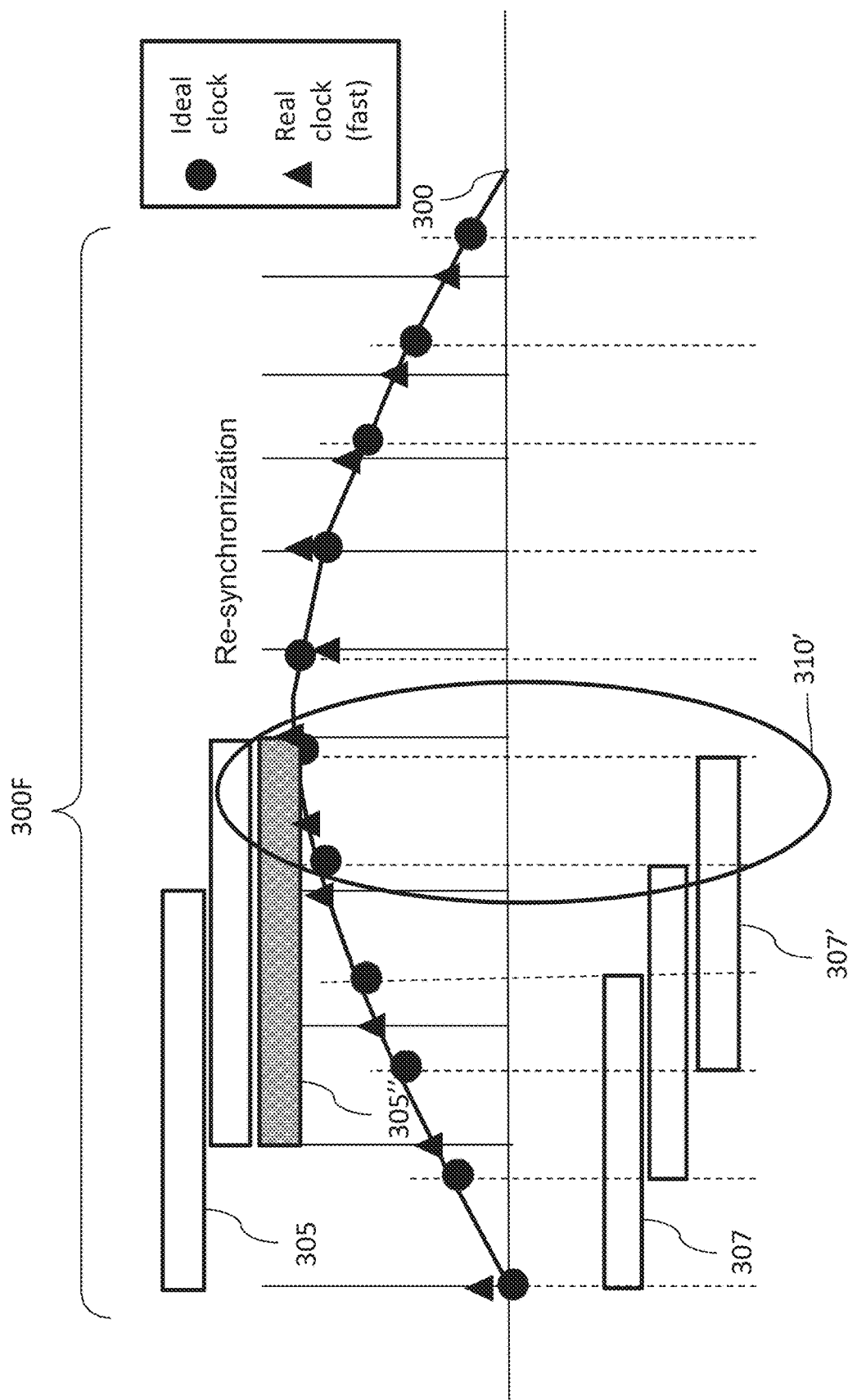

FIG. 13 illustrates a re-synchronization in region 310' of a data slice 305" with the data slice 305'. The data slice 305" is produced by shifting the data slice 305' backward by a proper number of cycles (e.g., one cycle) of the real clock. This backwards shift may be performed by, e.g., the clock recovery algorithm described above with respect to FIGS. 2-7, reducing subsequent errors in data processing.

FIG. 14 illustrates a plot 400 of waveforms showing a clock recovery algorithm applied to data taken with a sampling clock having a positive offset (in other words, a sampling clock faster than the desired data rate), in accordance with some embodiments. The plot 400 includes a sampling clock 402, trigger 404, sampled data stream 406, and corrected data stream 408. Trigger 404 is a pulse indicating the end of an observation window and the beginning of a clock recovery correction phase. After trigger 404, samples of the sampled data stream 406 are suppressed in the corrected data stream 408 by forcing the value of the samples from 1 to 0. This is applied until the correct number of samples have been suppressed to compensate for the positive offset of the sampling clock 402.

FIG. 15 illustrates a plot 500 of waveforms showing a clock recovery algorithm applied to data taken with a sampling clock having a negative offset (in other words, a sampling clock slower than the desired data rate), in accordance with some embodiments. The plot 400 includes a sampling clock 502, trigger 504, sampled data stream 506, and corrected data stream 508. After trigger 504, which indicates the beginning of a clock recovery correction phase, samples are added to the sampled data stream 506 in the corrected data stream 508. This may be done by setting values of the troughs between samples in the corrected data stream 508 from 0 to 1. This is applied until the correct number of samples have been added to compensate for sample losses from the negative offset of the sampling clock 502.

FIG. 16 illustrates an implementation of a clock recovery algorithm in RTL, in accordance with some embodiments. The clock recovery algorithm of FIG. 16 implements the data stream recovery method 140 described above with respect to FIGS. 2 and 4 as a hardware algorithm. However, the clock recovery algorithm described in FIG. 16 may also be implemented in software.

In some embodiments, a clock recovery algorithm (e.g., a clock recovery algorithm as described above with respect to FIGS. 2-4) is implemented on a semiconductor chip. The semiconductor chip includes circuitry for wake-up radio using the IEEE 802.11ba standard. The clock recovery algorithm is applied to a data stream coming from an ADC coupled to an antenna. However, the clock recovery algorithm may be implemented using any suitable circuit components or software stored in a computer readable storage medium for execution by a microprocessor and integrated on any suitable chip, die, storage medium, or device.

Example embodiments of the disclosure are summarized here. Other embodiments can also be understood from the entirety of the specification as well as the claims filed herein.

Example 1. A method of processing a data stream, the method including: taking a first number of samples of the data stream using a sampling clock over a first observation window, and storing a stored data stream including the first number of samples in a data buffer, where a length of the first observation window is determined by a reference clock; determining a measured number of cycles of the sampling clock from the first number of samples; measuring an error between an expected number of cycles of the sampling clock and the measured number of cycles of the sampling clock in the observation window; updating the stored data stream corresponding to the first observation window to contain a second number of samples by correcting the first number of samples with the error; and decoding the data stream based on processing the second number of samples.

Example 2. The method of example 1, where the data stream includes a plurality of frames, further including: taking a third number of samples of the data stream using the sampling clock over a second observation window, the stored data stream including the third number of samples, where a length of the second observation window is determined by the reference clock; and updating the stored data stream corresponding to the second observation window to contain a fourth number of samples by correcting the third number of samples with the error, the decoding of the data stream being further based on processing the fourth number of samples.

Example 3. The method of one of examples 1 or 2, where the reference clock has a slower frequency than the sampling clock.

Example 4. The method of one of examples 1 to 3, where the reference clock has greater precision than the sampling clock.

Example 5. The method of one of examples 1 to 4, where the data stream is an on-off keying modulation of a carrier wave.

Example 6. The method of one of examples 1 to 5, where the data stream is free of timing information.

Example 7. The method of one of examples 1 to 6, where the sampling clock and the reference clock are on a same semiconductor chip.

Example 8. The method of example 7, where the semiconductor chip is part of a wake-up radio.

Example 9. A method for resynchronizing a data stream, the method including: oversampling the data stream to form a sampled data set, where a sampling rate of the oversampling is determined by a sampling clock, the sampled data set being stored in a data buffer; counting a measured number of cycles of the sampling clock over an observation window, where the length of the observation window is determined by a reference clock; indicating the end of the observation window by sending a trigger to a data stream recovery method; executing the data stream recovery method, the data stream recovery method including: determining a difference between the measured number of cycles of the sampling clock over the observation window and an expected number of cycles of the sampling clock over the observation window; and adding or subtracting a number of samples equal to the difference from the sampled data set in the data buffer; and after executing the data stream recovery method, decoding the sampled data set.

Example 10. The method of example 9, where the data stream is an asynchronous transmission.

Example 11. The method of one of examples 9 or 10, where the sampling clock and the reference clock are components of a semiconductor chip.

Example 12. The method of example 11, where the semiconductor chip is a component of a receiver.

Example 13. The method of one of examples 9 to 12, where subtracting a sample from the sampled data set includes forcing the valid bit of the sample to zero in the data buffer.

Example 14. A system for processing a data stream, the system including: a sampling clock, the sampling clock having a first frequency; a reference clock, the reference clock having a second frequency, the second frequency being smaller than the first frequency, the reference clock being more precise than the sampling clock, the reference clock being configured to measure the length of an observation window; a plurality of processors; and a non-transitory memory storing program instructions to be executed in the plurality of processors, the program instructions including instructions to: measure a difference between an expected number of cycles of the sampling clock in the observation window and a measured number of cycles of the sampling clock in the observation window; and correct a first number of samples taken from a transmission over the observation window by the difference measured, where the samples are taken using the sampling clock.

Example 15. The system of example 14, where the sampling clock and the reference clock are parts of a receiver.

Example 16. The system of example 15, where the receiver is a wake-up radio.

Example 17. The system of example 16, where the program instructions are configured to correct the number of samples while the receiver is receiving the transmission.

Example 18. The system of example 16, where the program instructions are configured to correct the number of samples after the receiver has received the transmission.

Example 19. The system of one of examples 16 to 18, where the program instructions further include instructions to force the respective valid bits of a second number of samples to zero when the measured number of cycles is greater than the expected number of cycles, the second number of samples being equal to the difference measured.

Example 20. The system of one of examples 16 to 19, where the program instructions further include instructions to duplicate a second number of samples when the measured number of cycles is less than the expected number of cycles, the second number of samples being equal to the difference measured.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A method of processing a data stream, the method comprising:
    taking a first number of samples of the data stream using a sampling clock over a first observation window, and storing a stored data stream comprising the first number of samples in a data buffer, wherein a length of the first observation window is determined by a reference clock;
    determining a measured number of cycles of the sampling clock from the first number of samples;
    measuring an error between an expected number of cycles of the sampling clock and the measured number of cycles of the sampling clock in the observation window;
    updating the stored data stream comprising the first number of samples to contain a second number of samples by correcting the first number of samples with the error; and
    decoding the data stream based on processing the second number of samples.

2. The method of claim 1, wherein the data stream comprises a plurality of frames, further comprising:
    taking a third number of samples of the data stream using the sampling clock over a second observation window, and storing another stored data stream comprising the third number of samples in the data buffer, wherein a length of the second observation window is determined by the reference clock; and
    updating the another stored data stream comprising the third number of samples to contain a fourth number of samples by correcting the third number of samples with the error, the decoding of the data stream being further based on processing the fourth number of samples.

3. The method of claim 1, wherein the reference clock has a slower frequency than the sampling clock.

4. The method of claim 1, wherein the data stream is an on-off keying modulation of a carrier wave.

5. The method of claim 1, wherein the data stream is free of timing information.

6. The method of claim 1, wherein the sampling clock and the reference clock are on a same semiconductor chip.

7. The method of claim 6, wherein the semiconductor chip is part of a wake-up radio.

8. The method of claim 1, wherein the sampling clock provides a sampling signal in a range of 4 MHz to 64 MHz.

9. A method for resynchronizing a data stream, the method comprising:
    oversampling the data stream to form a sampled data set, wherein a sampling rate of the oversampling is determined by a sampling clock, the sampled data set being stored in a data buffer;
    counting a measured number of cycles of the sampling clock over an observation window, wherein the length of the observation window is determined by a reference clock;
    indicating the end of the observation window by sending a trigger to a data stream recovery method;
    after sending the trigger to the data stream recovery method, executing the data stream recovery method in response to receiving the trigger, the data stream recovery method comprising:
        determining a difference between the measured number of cycles of the sampling clock over the observation window and an expected number of cycles of the sampling clock over the observation window; and
        adding or subtracting a number of samples equal to the difference from the sampled data set in the data buffer; and
    after executing the data stream recovery method, decoding the sampled data set.

10. The method of claim 9, wherein the data stream is an asynchronous transmission.

11. The method of claim 9, wherein the sampling clock and the reference clock are components of a semiconductor chip.

12. The method of claim 11, wherein the semiconductor chip is a component of a receiver.

13. The method of claim 9, wherein subtracting a sample from the sampled data set comprises forcing a valid bit of the sample to zero in the data buffer.

14. A system for processing a data stream, the system comprising:
    a sampling clock, the sampling clock having a first frequency;
    a reference clock, the reference clock having a second frequency, the second frequency being smaller than the first frequency, the reference clock having a smaller frequency than the sampling clock, wherein a length of an observation window is determined by the reference clock;
    a plurality of processors; and
    a non-transitory memory storing program instructions to be executed in the plurality of processors, the program instructions comprising instructions to:
        measure a difference between an expected number of cycles of the sampling clock in the observation window and a measured number of cycles of the sampling clock in the observation window; and
        correct a first number of samples taken from a transmission over the observation window by the difference measured, wherein the samples are taken using the sampling clock.

15. The system of claim 14, wherein the sampling clock and the reference clock are parts of a receiver.

16. The system of claim 15, wherein the receiver is a wake-up radio.

17. The system of claim 15, wherein the program instruction comprise instructions to correct the first number of samples while the receiver is receiving the transmission.

18. The system of claim 15, wherein the program instruction comprise instructions to correct the first number of samples after the receiver has received the transmission.

19. The system of claim 14, wherein the instructions to correct the first number of samples comprise instructions to force respective valid bits of a second number of samples to zero when the measured number of cycles is greater than the expected number of cycles, the second number of samples being equal to the difference measured.

20. The system of claim 14, wherein the instructions to correct the first number of samples comprise instructions to duplicate a second number of samples when the measured number of cycles is less than the expected number of cycles, the second number of samples being equal to the difference measured.

* * * * *